United States Patent [19]
Hosier et al.

[11] Patent Number: 6,066,883
[45] Date of Patent: May 23, 2000

[54] GUARDING FOR A CMOS PHOTOSENSOR CHIP

[75] Inventors: Paul A. Hosier, Rochester; Jagdish C. Tandon, Fairport; Scott L. Tewinkle, Ontario, all of N.Y.

[73] Assignee: Xerox Corporation, Stamford, Conn.

[21] Appl. No.: 09/039,523

[22] Filed: Mar. 16, 1998

[51] Int. Cl.[7] .................................................. H01L 31/042
[52] U.S. Cl. .......................... 257/452; 257/431; 257/435; 257/443; 257/444; 257/620; 358/513; 358/514; 358/482
[58] Field of Search ..................... 257/409, 431, 257/435, 443, 444, 620; 358/513, 514, 482

[56] References Cited

U.S. PATENT DOCUMENTS

| | | | |
|---|---|---|---|
| 4,458,260 | 7/1984 | McIntyre et al. ......................... 357/30 |
| 4,536,658 | 8/1985 | Ludington ................................ 250/578 |
| 4,548,671 | 10/1985 | Kosonocky et al. ..................... 156/643 |
| 4,651,187 | 3/1987 | Sugimoto et al. ......................... 357/30 |
| 4,687,537 | 8/1987 | Hoffman et al. ......................... 156/612 |
| 5,614,744 | 3/1997 | Merrill .................................... 257/291 |
| 5,696,626 | 12/1997 | Hosier et al. ............................. 358/482 |

*Primary Examiner*—Edward Wojciechowicz
*Assistant Examiner*—Bradley William Baumeister
*Attorney, Agent, or Firm*—R. Hutter

[57] ABSTRACT

In a CMOS-based photosensor chip, the area between the last photosensor in a linear array of photosensors and the edge of the chip can be a source of unintended charge generation affecting the last photosensor. A guardring, in the form of a biased diffusion area, prevents the unwanted leakage of charge from the edge area to the end photosensor.

20 Claims, 2 Drawing Sheets

GUARDING FOR A CMOS PHOTOSENSOR CHIP

FIELD OF THE INVENTION

The present invention relates to photosensitive chips for creating electrical signals from an original image, as would be found, for example, in a digital scanner or facsimile machine. Specifically, the present invention relates to a guardring which is particularly useful in CMOS-based photosensor chips.

BACKGROUND OF THE INVENTION

In the context of document processing, a raster input scanner, or simply "scanner," is a device by which an image on a hard-copy original, such as a sheet of paper, is converted into digital data. A common design for a scanner includes a linear array of photosensitive elements, which form photosensors. Each photosensor in the array is adapted to output a signal, typically in the form of an electrical charge or voltage, of a magnitude proportional to or otherwise related to the intensity of light incident on the photosensor. By providing a linear array of these photosensors and causing the array to scan relative to the hard-copy original, each photosensor will output a sequence of charge signals resulting from the various gradations of dark and light in the image as the individual photosensors move through a path relative to the image.

In most low-cost scanners, such as presently found in inexpensive facsimile machines, the most typical technology for creating such a scanner is the charge-coupled device, or CCD. For higher-quality applications, an emergent technology is CMOS. Various patents related to using CMOS technology in a photosensor chip, such as used in a scanner, are assigned to the assignee hereof.

The concept of "guardrings" is fairly common in the art of CMOS circuitry. Basically the idea is to create structures which isolate different circuit elements within a single chip, so the activities of one circuit on the chip do not interfere with those of another. With photosensor chips, however, an additional design problem occurs because of the inherent photosensitivity of specific areas of the chip. Areas of the chip intended to act as photosensors of course generate electron-hole pairs whenever they are exposed to light, but other areas within the chip exhibit photosensitive properties as well and will generate electron-hole pairs even in portions of the chip which are not intended to act as photosensors. In the case of a full-width-array image scanner, in which a number of photosensor chips are intended to be butted so that the arrays of photosensors thereon form in effect a single long linear array of photosensors, a key problem occurs around the short area of each chip between the last photosensor in the linear array and the edge of the chip. Because the "critical edge" of the chip is the area where the chip is to be butted against another chip, and where it is desired to maintain a consistent spacing of all photosensors on adjacent chips, there is relatively small area on the chip to place structures which provide a desirable "guardring" effect.

DESCRIPTION OF THE PRIOR ART

In the prior art, U.S. Pat. Nos. 4,548,671 and 4,687,537 illustrate the use of guardring-like structures to isolate circuitry within CCD chips.

U.S. Pat. No. 5,696,626, assigned to the assignee hereof and having common co-inventors with the present invention, discloses a preferred architecture for the area of a photosensor chip between the last photosite in the array thereof and the edge of the chip. The teaching of this patent is mainly directed to providing a suitably dimensioned ridge near the edge so that a filter formed from a cured translucent liquid will be accurately retained on the surface of the chip.

SUMMARY OF THE INVENTION

According to one aspect of the present invention, there is provided a photosensitive chip defining a main surface and an edge of the main surface. A photosensor is defined on the main surface. A guardring is provided, at least a portion of the guardring being disposed between the photosensor and the edge. The guardring includes a diffusion layer.

DETAILED DESCRIPTION OF THE INVENTION

Figure 1:
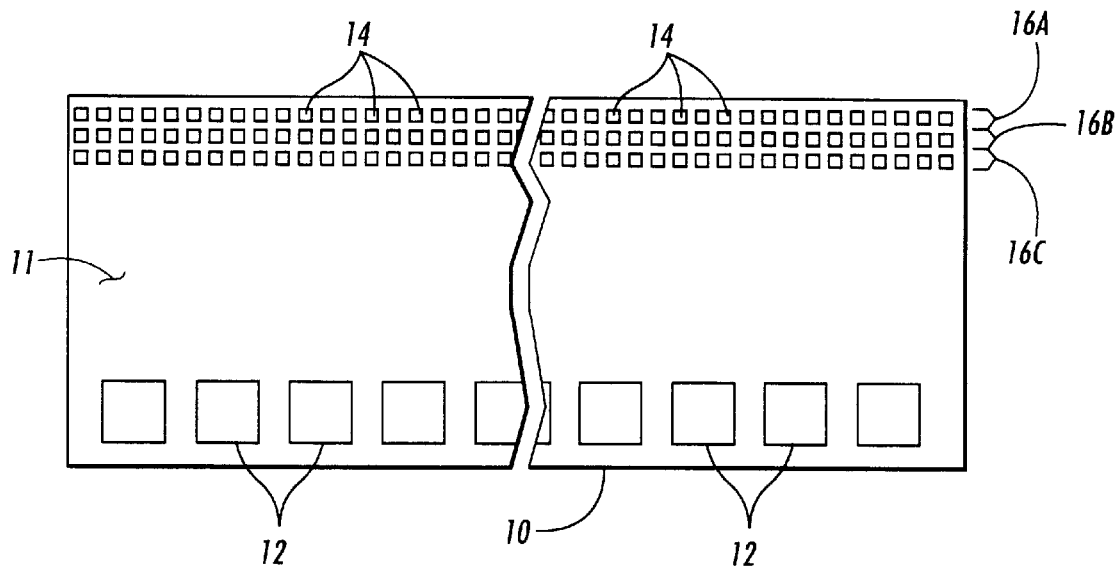
FIG. 1 is a plan view of a single photosensitive chip of a general design found, for example, in a full-color photosensor scanner.

FIG. 1 is a plan view of a single photosensitive chip, generally indicated as 10, of a general design found, for example, in a full-color photosensor scanner. A typical design of a full-page-width scanner will include a plurality of chips 10, each chip being approximately one-half to one inch in length, the chips being butted end-to-end to form an effective collinear array of photosensors, which extends across a page image being scanned. Each chip 10 is a silicon-based integrated circuit chip having defined in a main surface 11 thereof, in addition to any number of contact pads such as 12, three independently-functioning linear arrays of photosensors, each photosensor being here indicated as 14. The photosensors are disposed in three parallel rows which extend across a main dimension of the chip 10, these individual rows being shown as 16a, 16b, and 16c. Each individual row of photosensors on chip 10 can be made sensitive to a particular color, by applying to the particular row 16a, 16b, 16c a spectrally translucent filter layer (not shown) which covers only the photosensors in a particular row. Generally, each individual photosensor 14 is adapted to output a charge or voltage signal indicative to the intensity of light of a certain type impinging thereon; various structures, such as transfer circuits, or charge-coupled devices, are known in the art for processing signal output by the various photosensors corresponding to photosensors 14.

Figure 2:
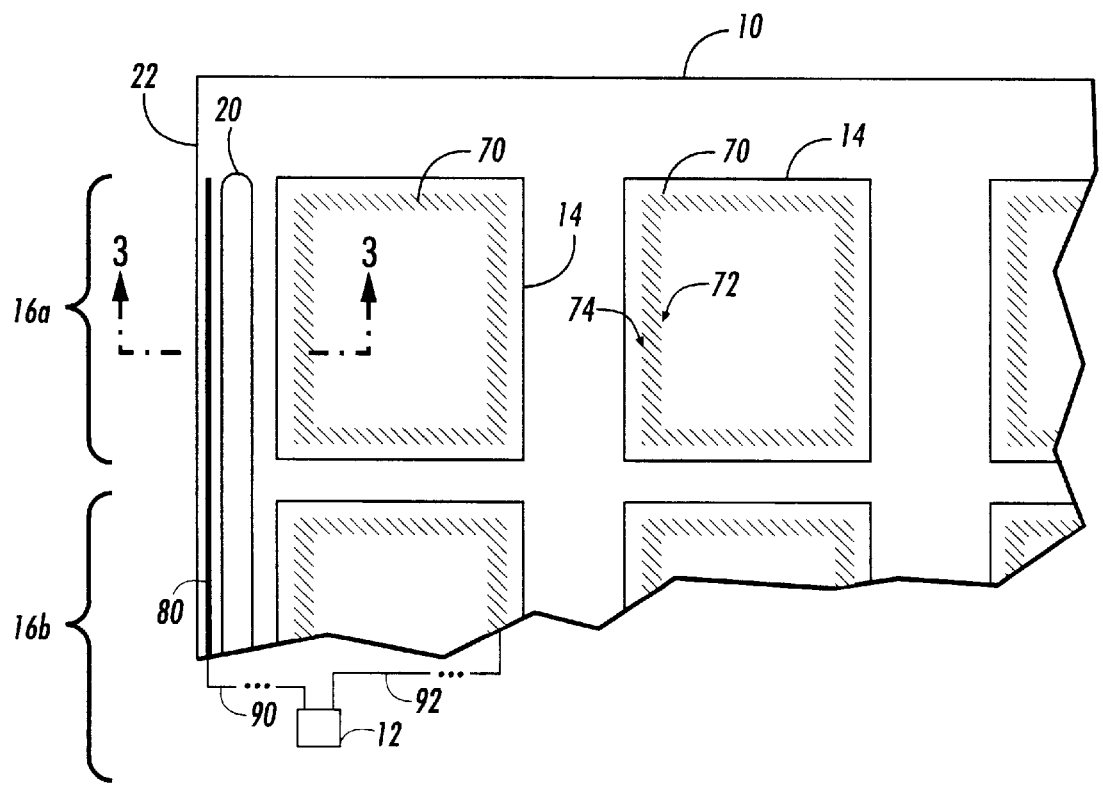
FIG. 2 is a detailed plan view, with additional circuitry shown schematically, showing the representative end photosensors on the chip.

FIG. 2 is a plan view showing representative photosensors 14 in two rows 16a, 16b, with additional circuitry shown schematically. Each photosensor 14 is of a generally rectangular shape, defining a perimeter, the perimeter of each photosensor being spaced from the perimeter of a neighboring photosensor by a spacing distance. According to one preferred design of a three-row, full-color photosensitive chip, for an image resolution of 400 spots per linear inch, each photosensor 14 has a dimension in the plan-view direction of 47.5 micrometers along the direction of extension of the linear arrays, and 63.5 micrometers along the direction perpendicular to the direction of the linear array.

Further, a desirable spacing between the borders of adjacent photosensors 14 is approximately seven micrometers from one border of a photosensor 14 in row 16a to the border of a neighboring photosensor in row 16b. Along the length of the linear array, the spacing between borders of adjacent photosensors within a particular row 16 is approximately fourteen to sixteen micrometers, as some designs of photosensitive chips will have various distances between different pairs of adjacent photosensors for optical purposes.

In one embodiment of the present invention, there is provided a ridge 20 which protrudes from the main surface of the chip, and is disposed to extend between the perimeter of an end photosensor 14 disposed at the end of a particular chip 10, and the edge 22 of the chip, as shown in FIG. 2. This ridge 20 protrudes a significant distance from the main surface 11 of the chip, typically about 0.8 to 1.2 micrometers from the surface formed by the end photosensor 14. Also visible in FIG. 2, within each photosensor 14, is an annular collection region indicated as 70, the function of which will be described in detail below.

Figure 3:
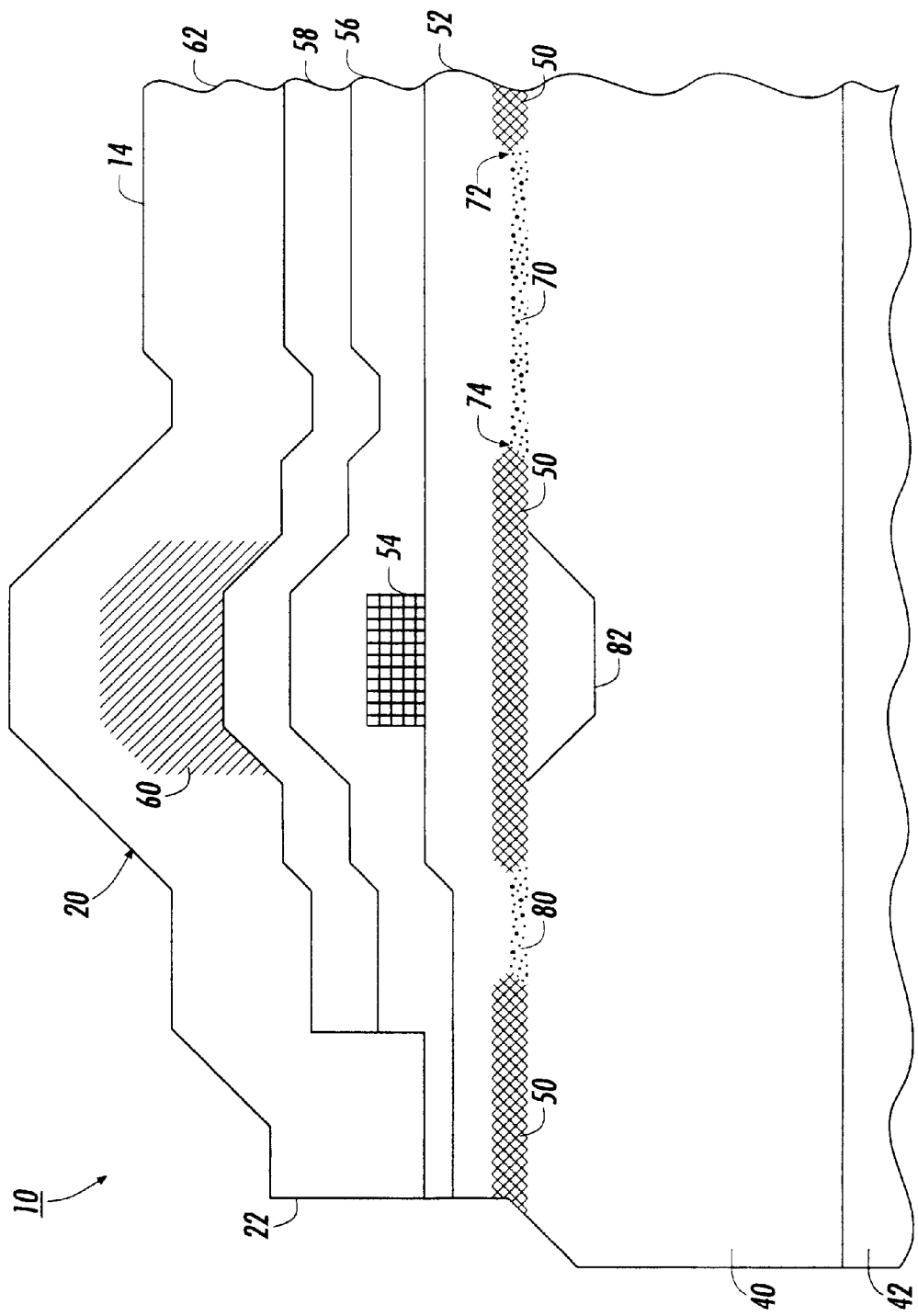
FIG. 3 is a detailed cross-sectional view, through line 3—3 in FIG. 2, showing the internal structure of a preferred embodiment of the critical edge area on a photosensor chip according to the present invention.

FIG. 3 is a detailed sectional view of the portion of chip 10 between the end photosensor 14 and the edge 22 of the chip. The chip includes a base layer 40 of single crystal P– doped epitaxial silicon, over a substrate 42 of single crystal P+ doped silicon. In general, all of the interconnect layers on the chip 10 are formed on a field oxide indicated as 50. Above this field oxide 50 is a layer of borophosphosilicon glass, indicated as 52. There is also a metal structure 54, which is typically made of aluminum, first and second layers 56 and 58 of "inter-metal oxide," and further a light shield indicated as 60, which is preferably made of aluminum. The topmost layer of both ridge 20 and the neighboring structures on the chip is an oxide layer here indicated as 62.

One key function of light shield 60 is to define the photosensitive area of a photosensor 14 by providing a uniformly conductive, as well as light-shielding, border to the photosensor 14. Also, the light shield 60 can be used to add a predetermined amount of capacitance associated with lead 54, so that the parasitic capacitance associated with lead 54 can be roughly equalized to the capacitance associated with leads which are disposed between neighboring photosensors along an array.

Further shown in the cross-sectional view of FIG. 3 is a portion of one of the annular collection regions indicated above as 70. With momentary reference to FIG. 2, it can be seen that, in a preferred embodiment of the present invention, an annular collection region 70 is preferably in the form of an N+ photodiode diffusion on the surface of the P– doped epitaxial silicon 40, which acts as a collection region for charge generated within the photosensor 14 in the depletion region within silicon 40. The annular collection region acts as a collection region for charges generated in the silicon layer 40 when a photosensor 14 is exposed to light. In brief, the annular collection region is connected to circuitry (not shown) which converts the charge generated in the photosensor area to a signal related to the light intensity on the photosensor 14 at a given time. The reason that the annular collection region 70 is of its characteristic "rectangular doughnut" shape as shown in the plan view of FIG. 2 is that the shape of annular collection region 70 minimizes capacitance within the photosensor 14. As shown, the annular collection region 70 defines an interior edge indicated as 72 (that is, the inside of the doughnut) and an exterior edge 74. For purposes of the claims below, this distance between the interior edge 72 and the exterior edge 74 represents the "width" of the annular collection region. This width dimension will have an important relationship to the guardring of the present invention. (Although an annular collection region is shown, the region need not be completely enclosed such as in the view of FIG. 2, and indeed other configurations of the collection diffusion, such as stripes or an x-shape, are possible equivalents, and such equivalent structures will typically have an effective "width" associated therewith as well.)

As mentioned above, in a CMOS-based photosensor chip, many structures within the chip may have a photosensor effect, that is they will generate charge when exposed to light, even if they are not intended to act as photosensors. One key area for the accidental generation of charge is the area of the chip between ridge 20 and the critical edge 22 of the chip 10. The absence of a light shield in this area causes the generation of unwanted charge which may be confused with a signal on the end photosensor 14; in other words, charge which is generated by light in substrate 40 in the area between edge 22 and ridge 20 may be accidentally collected by collection region 70 and considered a signal on the end photosite 14 even though the light that generated the charge did not pass through end photosensor 14, i.e. it was not intended to be detected by the chip. This is the reason for providing the guardring of the present invention.

With reference to FIG. 3, a guardring indicated as 80 is in the form of an N+ diffusion disposed generally between the ridge 20 and the edge 22 of chip 10. (Although the word "guardring" implies that the guardring 80 extends completely around an area of a chip, it will be understood that, for present purposes, the guardring diffusion 80 need only extend along one edge of the end photosensor 14.) Guardring 80 is in the form of a diffusion substantially similar to the diffusion which forms annular collection region 70, but instead of collecting charge generated within a photosensor 14, the guardring 80 collects charge generated in the region between ridge 20 and edge 22, so that the charge generated in this edge region does not leak into the area of end photosensor 14 to be collected by collection region 70.

As is known in the art of CMOS-based photosensor chips, as part of a readout process, an annular collection region 70 of a photosensor 14 is periodically biased with a predetermined priming or "fat zero" potential, to establish a reference bias on the signal generated by the photosensor 14. Just as annular collection region 70 is typically connected to a selectably biased transfer circuit (not shown) for converting the charge on photosensor 14 into a signal, the guardring 80 is biased, through means not shown but which would be apparent to one of skill in the art, in such a manner that the guardring 80 would attract charge generated within silicon 40. The overall objective is that the guardring 80 is of such dimensions, and is biased to such an extent, that there is net zero current flow between end photosensor 14 and the region between ridge 20 and edge 22. In order to reach this optimal condition of net zero current flow, the two critical parameters are the width of guardring 80 (such as shown in FIG. 3) relative to the width of annular collection region 70, and the relative bias on annular collection region 70 and the guardring 80.

With regard to the width of guardring 80 relative to the width of collection region 70, the guardring 80 should be from one-half to one-third the width of annular collection region 70. For a 400 spi arrangement of photosensors 14, with each photosensors 14 being 48 microns in width as shown in the view of FIG. 3, a typical width of annular diffusion region 70 is approximately 3 micrometers, the region between edge 22 and ridge 20 is approximately 8 micrometers, so the guardring should be approximately 1 micrometer in width, but no more than 3 micrometers.

The bias on guardring 80 should be less than the typical bias placed on the annular collection region 70 in the course of collecting charge in end photosensor 14, and more preferably should be less than one volt less than the bias on the annular collection region 70. Further, the bias on guardring 80 should be significantly less than (such as less than one-half) the highest potential placed anywhere on chip 10: for instance, if the highest voltage applied anywhere on the chip 10 is five volts, the bias on guardring 80 should be between 1 and 2 volts. (With reference to the claims below, a "means for biasing" the guardring 80 or the annular collection region 70 will be understood as possibly including merely an arrangement of conductors, such as shown schematically in FIG. 2 as connections 90 or 92, which ultimately connect the guardring 80 or the collection region 70 to an off-the-chip power supply, such as through one of the contact pads 12.)

Another structure which is useful in restricting the current flow between the end photosensor 14 and the region between ridge 20 and edge 22 is a blocking layer indicated in FIG. 3 as 82. This blocking layer is simply a P+ doped area placed as shown within the P− doped epitaxial silicon layer 40. This blocking layer 82 further prevents the drift of electrons between the edge 22 and the end photosensor 14.

It should further be noted that the guardring such as 80 of the present invention could also be disposed parallel to the direction of a linear array of photosensors 14, and thus could function as a guardring for a large number of photosensors in the array.

While the invention has been described with reference to the structure disclosed, it is not confined to the details set forth, but is intended to cover such modifications or changes as may come within the scope of the following claims.

What is claimed is:

1. A photosensitive chip defining a main surface and an edge of the main surface, comprising:
    a photosensor defined on the main surface, the photosensor defining a perimeter;
    a guardring, at least a portion of the guardring being disposed between the photosensor and the edge, the guardring including a diffusion layer; and a light shield disposed between the photosensor and the edge.

2. The chip of claim 1, the guardring defining a width along a dimension between the perimeter of the photosensor and the edge of no more than three micrometers.

3. The chip of claim 1, wherein the photosensor includes a collection region, the collection region defining a width.

4. The chip of claim 3, the guardring defining a width along a dimension between the photosensor and the edge which is less than the width of the collection region.

5. The chip of claim 4, the guardring defining a width of less than one-half the width of the collection region.

6. The chip of claim 1, further comprising means for biasing the guardring.

7. The chip of claim 6, the means for biasing the guardring biasing the guardring at less than one-half the maximum bias of any element of the chip.

8. The chip of claim 1, the photosensor including a collection diffusion, and further comprising
    means for biasing the guardring and means for biasing the collection diffusion.

9. The chip of claim 8, the means for biasing the guardring biasing the guardring at no more than one volt difference from a bias on the collection diffusion.

10. A photosensitive chip defining a main surface and an edge of the main surface, comprising:
    a photosensor defined on the main surface, the photosensor including a collection diffusion, the collection diffusion defining a width;
    a guardring, at least a portion of the guardring being disposed between the photosensor and the edge; and
    means for independently biasing at least one of the collection diffusion and the guardring to allow net zero current flow between the collection diffusion and the guardring.

11. The chip of claim 10, the guardring defining a width along a dimension between the photosensor and the edge which is less than the width of the collection diffusion.

12. The chip of claim 11, the guardring defining a width of less than one-half the width of the collection diffusion.

13. The chip of claim 10, the means for biasing the collection diffusion and the guardring biasing the guardring at less than one-half the maximum bias of any element of the chip.

14. The chip of claim 10, the means for biasing the guardring biasing the guardring at no more than one volt difference from a bias on the collection diffusion.

15. A photosensitive chip defining a main surface and an edge of the main surface, comprising:
    a photosensor defined on the main surface, the photosensor including a collection diffusion, the collection diffusion defining a width;
    a guardring, at least a portion of the guardring being disposed between the photosensor and the edge, the guardring including a diffusion layer electrically separate from the collection diffusion, the guardring defining a width along a dimension between the photosensor and the edge which is less than the width of the collection diffusion.

16. The chip of claim 15, the guardring defining a width of less than one-half the width of the collection diffusion.

17. The chip of claim 15 further comprising means for independently biasing at least one of the collection diffusion and the guardring to allow net zero current flow between the collection diffusion and the guardring.

18. The chip of claim 15, further comprising a light shield disposed between the collection diffusion and the edge.

19. The chip of claim 15, the collection diffusion occupying only a portion of a light-collection area of the photosensor.

20. The chip of claim 19, the collection diffusion forming an annular collection region within the light-collection area of the photosensor.

* * * * *